(12) United States Patent
Tu et al.

(10) Patent No.: US 12,513,965 B2
(45) Date of Patent: Dec. 30, 2025

(54) TRENCH-GATE FIELD EFFECT TRANSISTOR

(71) Applicant: FORCE MOS TECHNOLOGY CO., LTD., New Taipei (TW)

(72) Inventors: Kao-Way Tu, Hsinchu (TW);
Yuan-Shun Chang, Hsinchu (TW);
Po-An Tsai, New Taipei (TW);
Huan-Chung Weng, New Taipei (TW)

(73) Assignee: FORCE MOS TECHNOLOGY CO., LTD., New Taipei (TW)

( * ) Notice: Subject to any disclaimer, the term of this patent is extended or adjusted under 35 U.S.C. 154(b) by 468 days.

(21) Appl. No.: 18/320,309

(22) Filed: May 19, 2023

(65) Prior Publication Data
US 2023/0411470 A1   Dec. 21, 2023

(30) Foreign Application Priority Data
Jun. 21, 2022  (TW) ................................ 111123071

(51) Int. Cl.
*H10D 64/23* (2025.01)
*H10D 30/01* (2025.01)
*H10D 30/66* (2025.01)

(52) U.S. Cl.
CPC ....... *H10D 64/252* (2025.01); *H10D 30/0295* (2025.01); *H10D 30/0297* (2025.01); *H10D 30/668* (2025.01)

(58) Field of Classification Search
CPC ............... H10D 64/117; H10D 64/252; H10D 64/2527; H10D 64/512; H10D 64/513; H10D 64/519; H10D 62/124; H10D 62/127; H10D 62/157; H10D 30/0295; H10D 30/0297; H10D 30/63; H10D 30/668
USPC ........................................................ 257/330
See application file for complete search history.

(56) References Cited

U.S. PATENT DOCUMENTS

| | | | |
|---|---|---|---|
| 10,332,992 B1 * | 6/2019 | Kondo ................. | H10D 64/513 |
| 2013/0234241 A1 * | 9/2013 | Bowers ................ | H10D 64/513 |
| | | | 257/330 |

* cited by examiner

*Primary Examiner* — Fazli Erdem
(74) *Attorney, Agent, or Firm* — Birch, Stewart, Kolasch & Birch, LLP (57) ABSTRACT

A trench-gate field effect transistor includes a plurality of trenches, a plurality of gate electrode units, and a plurality of source electrode units. Each of the trenches has a first trench region, a second trench region having a width less than that of the first trench region, and a neck trench region extending between the first trench region and the second trench region. Each of the gate electrode units includes a pair of first gate electrode portions disposed in the first trench region, a pair of second gate electrode portions disposed in the neck trench region, and a third gate electrode portion disposed in the second trench region. Each of the source electrode units includes a first source electrode portion disposed between a pair of the first gate electrode portions, and a second source electrode portion connected to the first source electrode portion.

16 Claims, 12 Drawing Sheets

TRENCH-GATE FIELD EFFECT TRANSISTOR

CROSS-REFERENCE TO RELATED APPLICATION

This application claims priority to Taiwanese Invention Patent Application No. 111123071, filed on Jun. 21, 2022.

FIELD

The disclosure relates to a field effect transistor, and more particularly to a trench-gate field effect transistor.

BACKGROUND

As market demand for high-frequency power components gradually increases, demand for trench-gate field effect transistors with low on-resistance and low rated voltage also grows. A trench-gate field effect transistor essentially includes an epitaxial lamination structure, a plurality of trenches recessed downwardly from a top surface of the epitaxial lamination structure, a plurality of gate electrodes respectively disposed on the trenches, a plurality of source electrodes disposed among the trenches, a drain electrode disposed on a bottom surface of the epitaxial lamination structure, and a plurality of metal contact electrodes disposed on the epitaxial lamination structure and adapted to be electrically connected to the gate electrodes and the source electrodes, respectively. In the trench-gate field-effect transistor, the gate electrodes are disposed in the trenches, respectively, such that the on-resistance and turn-on energy loss may be reduced by increasing density of the trenches (i.e., decreasing width of a mesa between two adjacent ones of the trenches) or decreasing distances among the gate electrodes and the source electrodes. The abovementioned method facilitates the development of miniaturization of the trench-gate field-effect transistor.

However, when the density of the trenches is increased, capacitance between the source electrodes and the gate electrodes is also increased, thereby causing a Miller effect. In addition, configuration of the metal contact electrodes also limits the development of on-resistance reduction and the miniaturization of the trench-gate field effect transistor in term of space.

SUMMARY

Therefore, an object of the disclosure is to provide a trench-gate field effect transistor that can alleviate at least one of the drawbacks of the prior art.

According to the disclosure, the trench-gate field effect transistor includes an epitaxial lamination structure, a plurality of trenches, a plurality of gate electrode units, a plurality of source electrode units, a plurality of insulation units, an isolation unit, a contact electrode unit, and a drain electrode.

The epitaxial lamination structure includes an epitaxial substrate having a first conductive type, an epitaxial layer disposed on the epitaxial substrate and having the first conductive type, a plurality of mesa regions disposed in the epitaxial layer and spaced apart from each other in a first direction, a plurality of well regions having a second conductive type and formed downwardly from top surfaces of the mesa regions, respectively, and a plurality of source electrodes having the first conductive type and disposed in the well regions, respectively.

The trenches are recessed downwardly from a top surface of the epitaxial layer, extend in a second direction transverse to the first direction, and are spaced apart from each other in the first direction. Each of the trenches has a first trench region extending in the second direction and having a width in the first direction, a second trench region extending in the second direction Y and having a width in the first direction less than the width of the first trench region, and a neck trench region extending between the first trench region and the second trench region and having a width in the first direction decreasing gradually along the second direction from the width of the first trench region to the width of the second trench region. Each of the trenches has an upper trench portion and a lower trench portion disposed below and spatially communicating with the upper trench portion in a depth direction transverse to the first and second directions. Each of the mesa regions is disposed between two corresponding ones of the trenches.

Each of the gate electrode units is disposed in the upper trench portion of a corresponding one of the trenches, and includes a pair of first gate electrode portions disposed in the first trench region of a corresponding one of the trenches and spaced apart from each other in the first direction, a pair of second gate electrode portions disposed in the neck trench region of the corresponding one of the trenches, and a third gate electrode portion disposed in the second trench region of the corresponding one of the trenches, such that each of the second gate electrode portions interconnects a corresponding one of the first gate electrode portions and the third gate electrode portion.

The source electrode units are disposed in the trenches, respectively. Each of the source electrode units includes a first source electrode portion disposed between a pair of the first gate electrode portions of a corresponding one of the gate electrode units, and a second source electrode portion connected to the first source electrode portion. The first source electrode portion has a top end surface at the same level with the top surface of the epitaxial layer and extends downwardly in the depth direction from the top end surface into the lower trench portion. The second source electrode portion is connected to a lower part of the first source electrode portion disposed in the lower trench portion and extends through the neck trench region to the second trench region.

The insulation units are disposed in the trenches, respectively, and cover the gate electrode units and the source electrode units, respectively.

The isolation unit is disposed on the epitaxial layer and has an electric insulating property.

The contact electrode unit includes a first contact electrode electrically connected to the third gate electrode portion of each of the gate electrode units, and a second contact electrode electrically connected to the source electrodes and the source electrode units.

The drain electrode is disposed on the epitaxial substrate opposite to the epitaxial layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIGS. 6 to 21 are schematic views showing some intermediate stages of the method depicted in FIGS. 5A and 5B, in which

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "downwardly," and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 1:
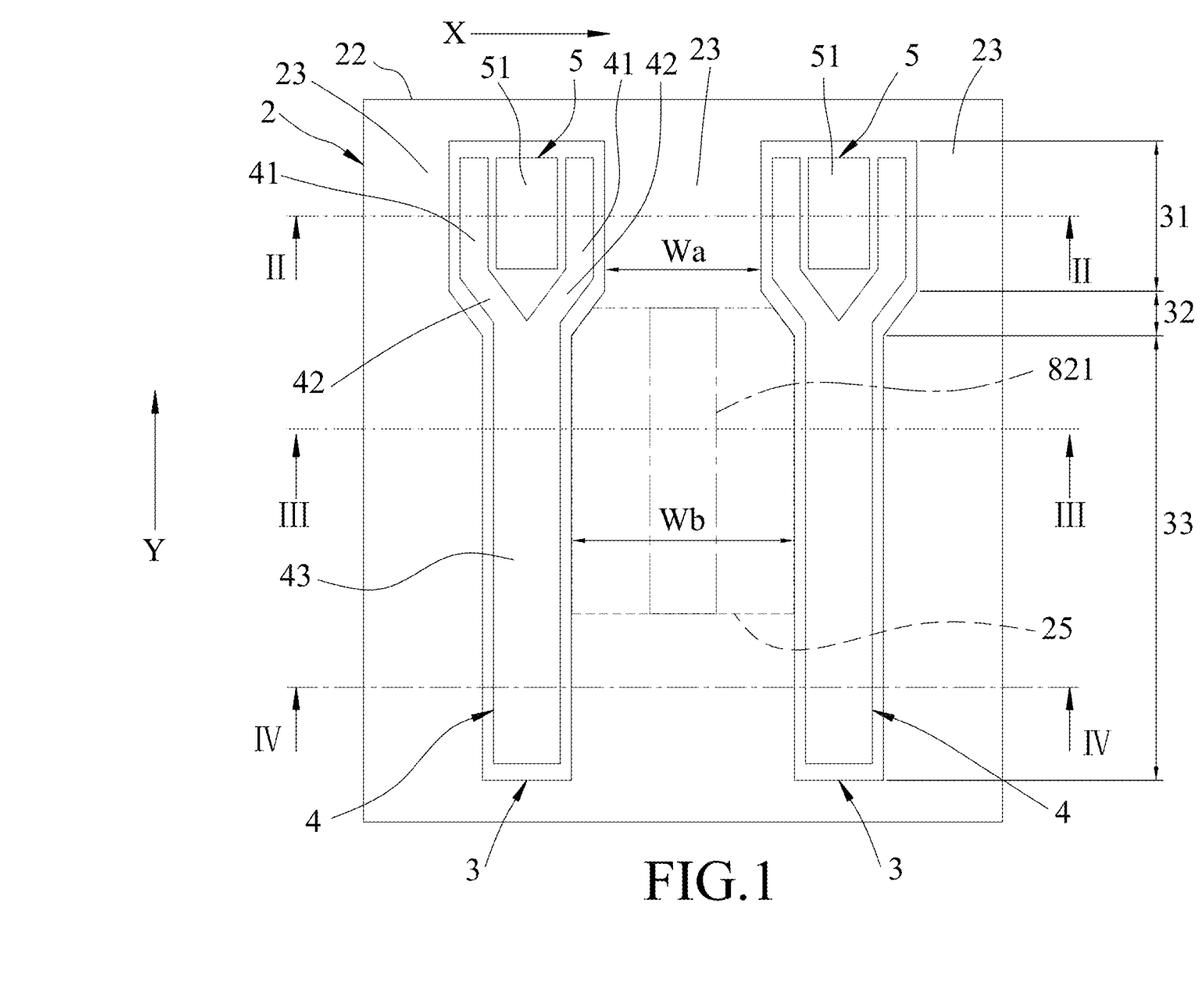
FIG. 1 is a schematic top view illustrating an embodiment of a trench-gate field effect transistor according to the disclosure.
Figure 2:
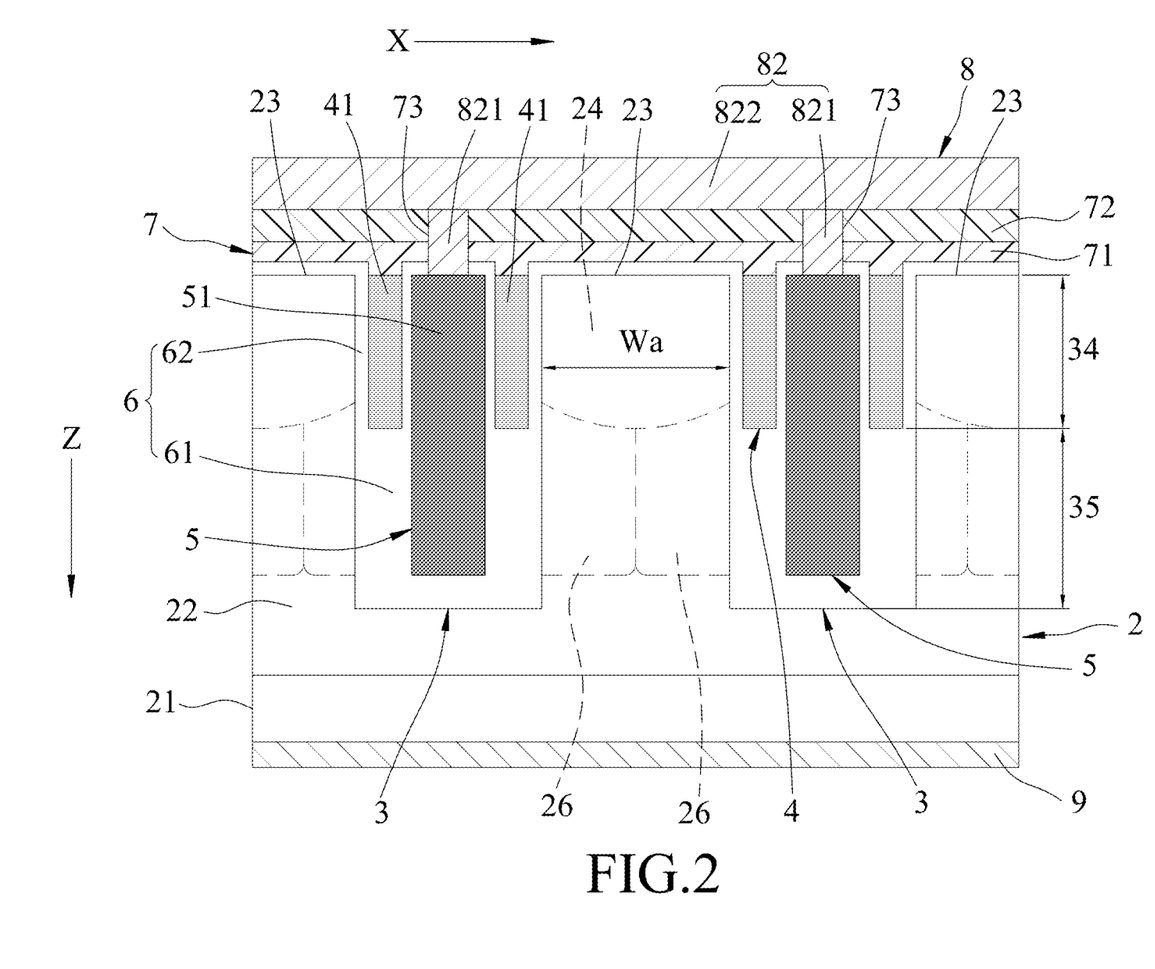
FIG. 2 is a schematic sectional view taken along line II-II of FIG. 1.
Figure 3:
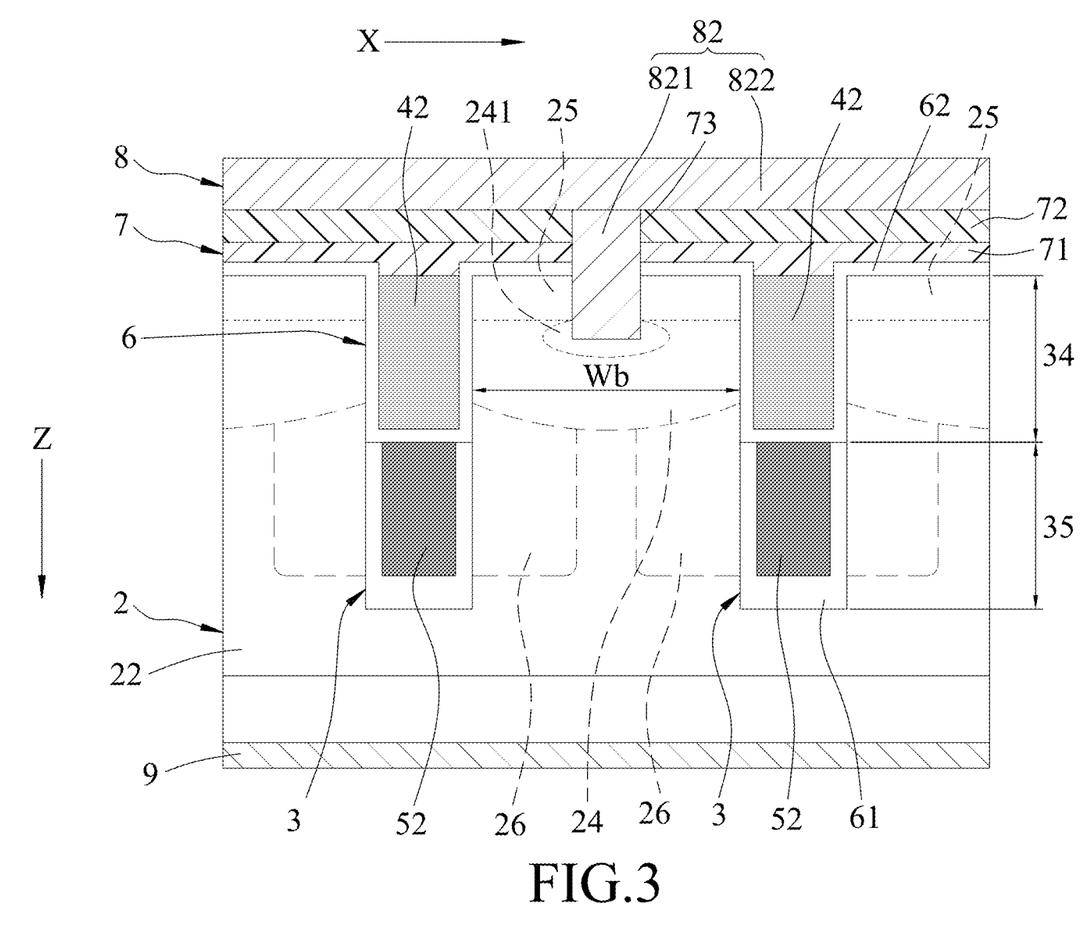
FIG. 3 is a schematic sectional view taken along line III-III of FIG. 1.
Figure 4:
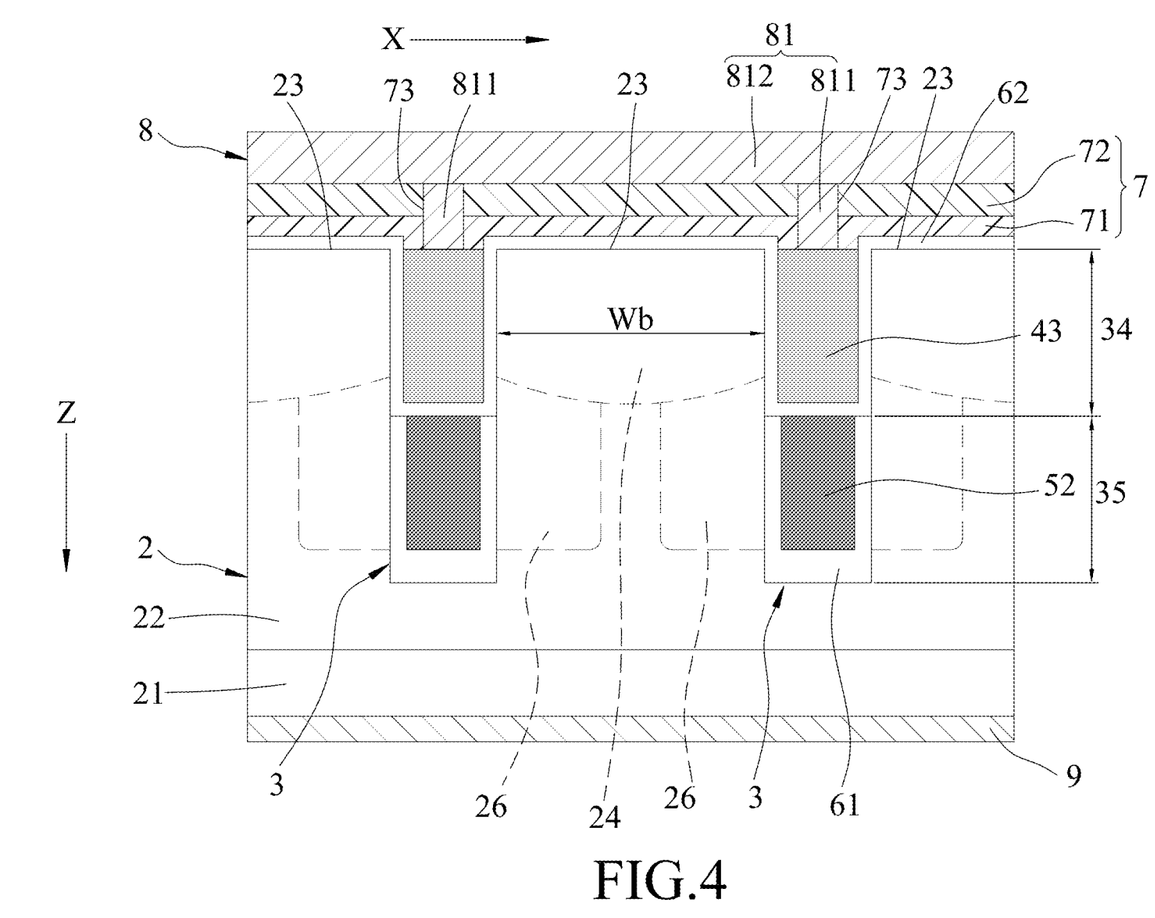
FIG. 4 is a schematic sectional view taken along line IV-IV of FIG. 1.

Referring to FIGS. 1 to 4, an embodiment of a trench-gate field effect transistor according to the disclosure includes an epitaxial lamination structure 2, a plurality of trenches 3, a plurality of gate electrode units 4, a plurality of source electrode units 5, a plurality of insulation units 6, an isolation unit 7, a contact electrode unit 8, and a drain electrode 9. In order to show the arrangement of the epitaxial lamination structure 2, the trenches 3, the gate electrode units 4, and the source electrode units 5, the isolation unit 7 and the contact electrode unit 8 are not shown in FIG. 1. FIGS. 2, 3, and 4 are schematic sectional views taken along lines II-II, III-III, and IV-IV of FIG. 1, respectively to show the isolation unit 7 and the contact electrode unit 8 disposed on a top surface of the epitaxial lamination structure 2 and the drain electrode 9 disposed on a bottom surface of the epitaxial lamination structure 2.

The epitaxial lamination structure 2 includes an epitaxial substrate 21 having a first conductive type, an epitaxial layer 22 disposed on the epitaxial substrate 21 and having the first conductive type, a plurality of mesa regions 23 disposed in the epitaxial layer 22 and spaced apart from each other in a first direction (X), a plurality of well regions 24 having a second conductive type and formed downwardly from top surfaces of the mesa regions 23, respectively, and a plurality of source electrodes 25 having the first conductive type and disposed in the well regions 24, respectively. The epitaxial layer 22 has a doping concentration smaller than that of the epitaxial substrate 21. The first conductive type is different from the second conductive type. In the embodiment, the first conductive type is an N type and the second conductive type is a P type.

The trenches 3 are recessed downwardly from a top surface of the epitaxial layer 22, extend in a second direction (Y) transverse to the first direction (X), and are spaced apart from each other in the first direction (X). Although two of the trenches 3 are illustrated in FIG. 1, the number of the trenches 3 is not limited thereto.

Each of the trenches 3 has a first trench region 31 extending in the second direction (Y) and having a width in the first direction (X), a second trench region 33 extending in the second direction (Y) and having a width in the first direction (X) smaller than the width of the first trench region 31, and a neck trench region 32 extending in the second direction (Y) and between the first trench region 31 and the second trench region 33 and having a width in the first direction (X) decreasing gradually along the second direction (Y) from the width of the first trench region 31 to the width of said second trench region 33. In addition, each of the trenches 3 has an upper trench portion 34 and a lower trench portion 35 disposed below and spatially communicating with the upper trench portion 34 in a depth direction (Z) transverse to the first and second directions (X, Y).

Each of the mesa regions 23 is disposed between two corresponding ones of the trenches 3. Each of the mesa regions 23 has a first width (Wa) in the first direction (X) between the first trench regions 31 of two corresponding adjacent ones of the trenches 3, and a second width (Wb) in the first direction (X) between the second trench regions 33 of two corresponding adjacent ones of the trenches 3. The first width (Wa) is smaller than the second width (Wb).

The well regions 24 have the second conductive type and are formed downwardly in the depth direction (Z) from the top surfaces of the mesa regions 23, respectively. Each of the well regions 24 is formed with a contact region 241 having a conductive type that is the same as that of the well regions 24 and having a doping concentration that is greater than that of the well regions 24.

Each of the source electrodes 25 is disposed substantially between the neck trench region 32 and the second trench region 33 of one of two corresponding ones of the trenches 3 and the neck trench region 32 and the second trench region 33 of the other one of the two corresponding ones of the trenches 3, as shown in FIGS. 1 and 3.

Each of the mesa regions 23 includes a pair of ion doping regions 26 disposed below a corresponding one of the well regions 24. Each of the ion doping regions 26 is disposed adjacent to a corresponding one of the trenches 3. Portions of the pair of the ion doping regions 26 disposed between the first trench regions 31 of two corresponding adjacent ones of the trenches 3 are connected to each other, as shown in FIG. 2. Portions of the pair of the ion doping regions 26 disposed between the second trench regions 33 of two corresponding adjacent ones of the trenches 3 are spaced apart from each other in the first direction, as shown in FIGS. 3 and 4. The ion doping regions 26 have the first conductive type and have a doping concentration greater than that of the epitaxial layer 22.

A thickness of the epitaxial layer 22 and depths of the trenches 3 can be determined according to actual applications and requirements. In the embodiment, the thickness of the epitaxial layer 22 ranges from about 3 μm to about 15 μm. The depth of each of the trenches 3 ranges from about 2 μm to about 9 μm. A center distance in the first direction (X) between the first trench region 31 of each of the trenches 3 and the first trench region 31 of an adjacent one of the trenches 3 ranges from about 2.5 μm to about 5.0 μm. The first width (Wa) of each of the mesa regions 23 ranges from about 1.0 μm to about 2.8 μm. The second width (Wb) of the each of the mesa regions 23 ranges from about 1.5 μm to about 3.5 μm.

The thickness of the epitaxial layer 22, the depths of the trenches 3, the center distance in the first direction (X) between the first trench region 31 of each of the trenches 3 and the first trench region 31 of an adjacent one of the trenches 3, the first width (Wa) of each of the mesa regions 23, and the second width (Wb) of the each of the mesa regions 23 are not limited to the dimensions defined above. For example, in some other embodiments, the center distance in the first direction (X) between the first trench region 31 of each of the trenches 3 and the first trench region 31 of an adjacent one of the trenches 3 may range from about 2.5 µm to about 3.5. The first width (Wa) of each of the mesa regions 23 may range from about 1.0 µm to about 1.3 µm. The second width (Wb) of the each of the mesa regions 23 may range from about 1.5 µm to about 2.0 µm.

Each of the gate electrode units 4 is disposed in the upper trench portion 34 of a corresponding one of the trenches 3. Each of the gate electrode units 4 includes a pair of first gate electrode portions 41 disposed in the first trench region 31 of a corresponding one of the trenches 3 and spaced apart from each other in the first direction (X), a pair of second gate electrode portions 42 disposed in the neck trench region 32 of the corresponding one of the trenches 3, and a third gate electrode portion 43 disposed in the second trench region 33 of the corresponding one of the trenches 3, such that each of the second gate electrode portions 42 interconnects a corresponding one of the first gate electrode portions 41 and the third gate electrode portion 43 so as to permit each of the gate electrode units 4 to be configured substantially in a Y shape, as shown in FIG. 1. In the embodiment, the gate electrode units 4 include a polysilicon material.

The source electrode units 5 are disposed in the trenches 3, respectively. Each of the source electrode units 5 includes a first source electrode portion 51 disposed between a pair of the first gate electrode portions 41 of a corresponding one of the gate electrode units 4, and a second source electrode portion 52 connected to the first source electrode portion 51. The first source electrode portion 51 has a top end surface at the same level with the top surface of the epitaxial layer 22 and extends downwardly in the depth direction (Z) from the top end surface into the lower trench portion 35. The second source electrode portion 52 is connected to a lower part of the first source electrode portion 51 disposed in the lower trench portion 35 and extends through the neck trench region 32 to the second trench region 33 and is disposed below the second gate electrode portions 42 and the third gate electrode portion 43 of a corresponding one of the gate electrode units 4. In the embodiment, the source electrode units 5 include a polysilicon material.

The insulation units 6 include a dielectric insulation material, for example, but not limited to, silicon oxide, silicon nitride, silicon oxynitride, or the like, or combination thereof. The insulation units 6 are disposed in the trenches 3, respectively, and cover the gate electrode units 4 and the source electrode units 5, respectively, so as to isolate the gate electrode units 4 and the source electrode units 5 from each other in electricity. Each of the insulation units 6 includes a first insulation layer 61 disposed in the lower trench portion 35 of a corresponding one of the trenches 3, and a second insulation layer 62 disposed in the upper trench portion 34 of the corresponding one of the trenches 3. The first insulation layer 61 of each of the insulation units 6 covers the second source electrode portion 52 and the lower part of the first source electrode portion 51 of a corresponding one of the source electrode units 5 disposed in the lower trench portion 35 of a corresponding one of the trenches 3. The second insulation layer 62 of each of the insulation units 6 covers an upper part of the first source electrode portion 51 of a corresponding one of the source electrode units 5 and a corresponding one of the gate electrode units 4 disposed in the upper trench portion 34 of a corresponding one of the trenches 3, and is disposed on the second source electrode portion 52 of a corresponding one of the source electrode units 5 and the first insulation layer 61. Top surfaces of the gate electrode units 4 and top surfaces of the first source electrode portions 51 of the source electrode units 5 are exposed from the second insulation layers 62 of the insulation units 6. In the embodiment, the insulation units 6 include silicon oxide, and the first insulation layer 61 has a thickness greater than that of the second insulation layer 62. The thickness of the first insulation layer 61 may range from about 200 nm to about 1000 nm.

The isolation unit 7 is disposed on the epitaxial layer 22 and has an electric insulating property. The isolation unit 7 includes a first isolation layer 71 disposed on the epitaxial layer 22 and a second isolation layer 72 disposed on the first isolation layer 71, and is formed with a plurality of openings 73 extending through the isolation unit 7. Some of the openings 73 are formed in positions corresponding to the positions of the first source electrode portions 51 of the source electrode units 5 disposed in the first trench regions 31 of the trenches 3, as shown in FIG. 2. Some of the openings 73 are formed in positions corresponding to the positions of the third gate electrode portions 43 of the gate electrode units 4 disposed in the second trench regions 33 of the trenches 3, as shown in FIG. 4. Remaining ones of the openings 73 are formed in positions corresponding to the positions of the source electrodes 25 disposed in the mesa regions 23, as shown in FIG. 3. The openings 73 formed in the positions corresponding to the positions of the source electrodes 25 has a dimension in the second direction (Y) that is substantially the same as a dimension of the source electrodes 25 in the second direction (Y). In the embodiment, the first isolation layer 71 includes a low temperature oxide (LTO), and the second isolation layer 72 includes a borophosphor silicate glass (BPSG). In some other embodiments, the first isolation layer 71 may include silicon oxide, and the second isolation layer 72 may include a phosphor silicate glass (PSG). In some other embodiments, the isolation unit 7 may be configured as a single layer, which includes LTO, BPSG, silicon oxide, or PGS.

The contact electrode unit 8 includes one or more conductive materials, and is used to be electrically connected to an external power supply (not shown). The contact electrode unit 8 includes a first contact electrode 81 electrically connected to the third gate electrode portion 43 of each of the gate electrode units 4, and a second contact electrode 82 electrically connected to the source electrodes 25 and the source electrode units 5. The first contact electrode 81 includes a plurality of first contact plugs 811 and a first extension electrode portion 812. Each of the first contact plugs 811 passes through a corresponding one of the openings 73 disposed in the positions corresponding to the positions of the third gate electrode portions 43 of the gate electrode units 4 so as to penetrate the isolation unit 7 and to be electrically connected to the third gate electrode portion 43 of a corresponding one of the gate electrode units 4. The first extension electrode portion 812 is disposed on the isolation unit 7 and is electrically connected to the first contact plugs 811. The second contact electrode 82 includes a plurality of second contact plugs 821 and a second extension electrode portion 822. The second contact plugs 821 pass through corresponding ones of the openings 73 disposed in positions corresponding to the positions of the first source electrode portions 51 of the source electrode units 5 and the positions of the source electrodes 25 to penetrate the isolation unit 7, so as to permit each of the source electrodes 25 to be electrically connected to a corresponding one of the second contact plugs 821 and to permit the first source electrode portion 51 of each of the source electrode units 5 to be electrically connected to a corresponding one of the second contact plugs 821. The second extension electrode portion 822 is disposed on the isolation unit 7 and is electrically connected to the second contact plugs 821. Each of the second contact plugs 821 electrically connected to the source electrodes 25 extends into a corresponding one of the well regions 24 and is in contact with the contact region 241 disposed in the corresponding one of the well regions 24, as shown in FIG. 3. In the embodiment, the first and second contact plugs 811, 821 include titanium, tungsten, or an alloy thereof, and the first and second extension electrode portions 812, 822 include aluminum.

The drain electrode 9 is disposed on the epitaxial substrate 21 opposite to the epitaxial layer 22, and includes a conductive material, for example, but not limited to, a metal, a transparent conductive metal oxide, a conductive polymer, or the like.

In each of the trenches 3 of the trench-gate field effect transistor according to the disclosure, the width of the second trench region 33 is smaller than the width of the first trench region 31 in the first direction (X), such that the first source electrode portion 51 and a pair of the first gate electrode portions 41 may be disposed in the first trench region 31, as shown in FIGS. 1 and 2, and such that the first width (Wa) of each of the mesa regions 23 in the first direction (X) may be reduced. Therefore, the trench-gate field effect transistor according to the disclosure may be further miniaturized, the on-resistance of the trench-gate field effect transistor according to the disclosure may be reduced effectively, and the pitch-off effect of the trench-gate field effect transistor according to the disclosure may be enhanced. In addition, the first contact plugs 811 used to permit the gate electrode units 4 to be electrically connected to the external power supply are disposed in positions corresponding to the positions of the second trench regions 33, and the second contact plugs 821 used to permit the source electrode units 5 to be electrically connected to the external power supply are disposed in positions corresponding to the positions of the first trench regions 31, which are distal from the positions of the second trench regions 33. Therefore, in the miniaturization of the trench-gate field-effect transistor, problems such as short circuit, inferior yield, or the like caused by process defects generated during formation of the contact electrodes when the contact plugs used to permit the gate electrode units to be electrically connected to the external power supply and the contact plugs used to permit the source electrode units to be electrically connected to the external power supply are disposed in the same regions may be reduced or avoided. Furthermore, the third gate electrode portion 43 of each of the gate electrode units 4 and the second source electrode portion 52 of a corresponding one of the source electrode units 5 are disposed in the upper trench portion 34 and the lower trench portion 35 of a corresponding one of the trenches 3, respectively, such that a capacitance area between the third gate electrode portion 43 and the second source electrode portion 52 may be reduced. Therefore, the capacitance between the third gate electrode portion 43 and the second source electrode portion 52 may be reduced when density of the trenches 3 is increased.

Figure 5A:
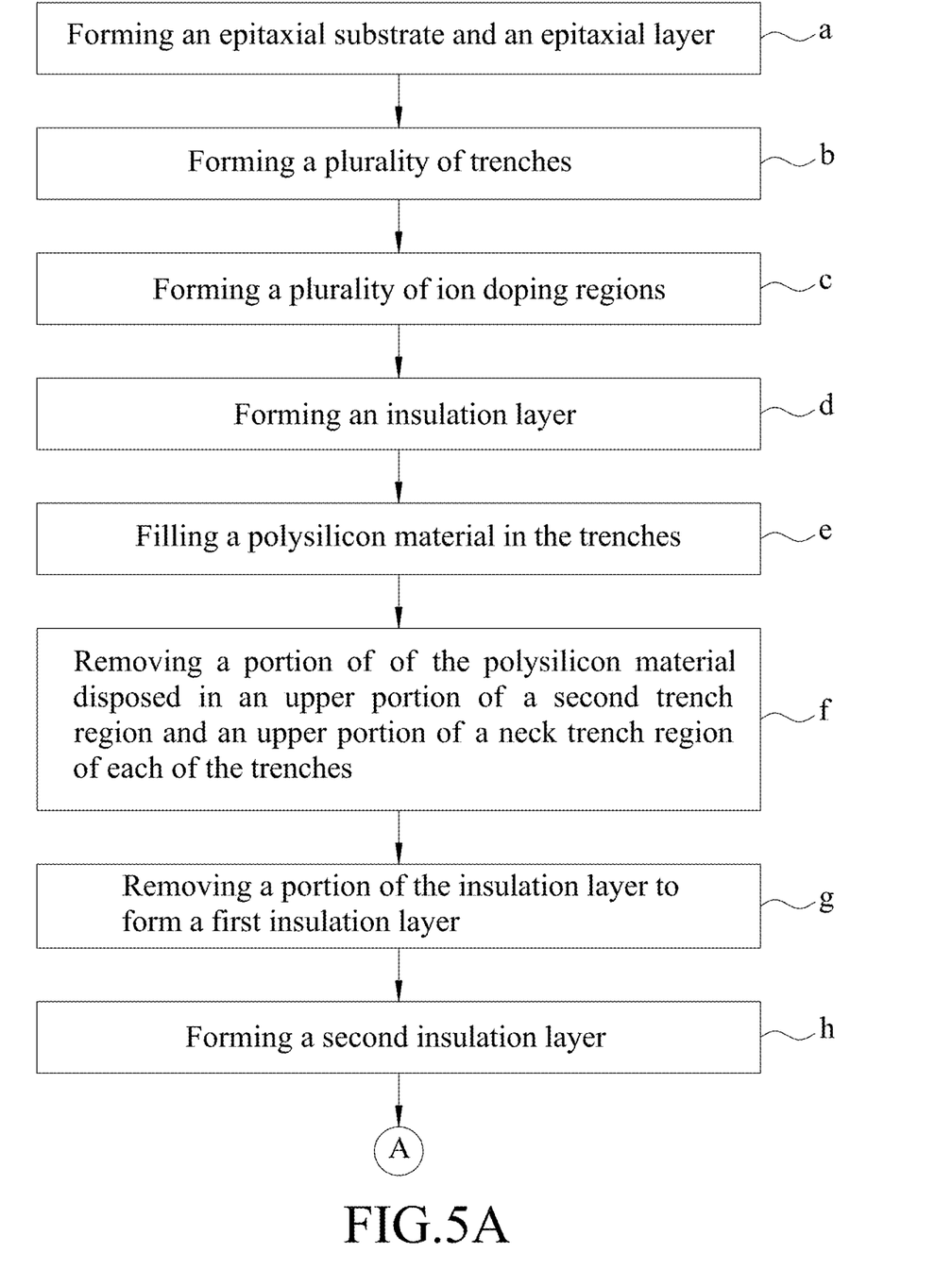
FIGS. 5A and 5B illustrate a flow diagram of a method for manufacturing the embodiment illustrated in FIGS. 1 to 4.
Figure 5B:
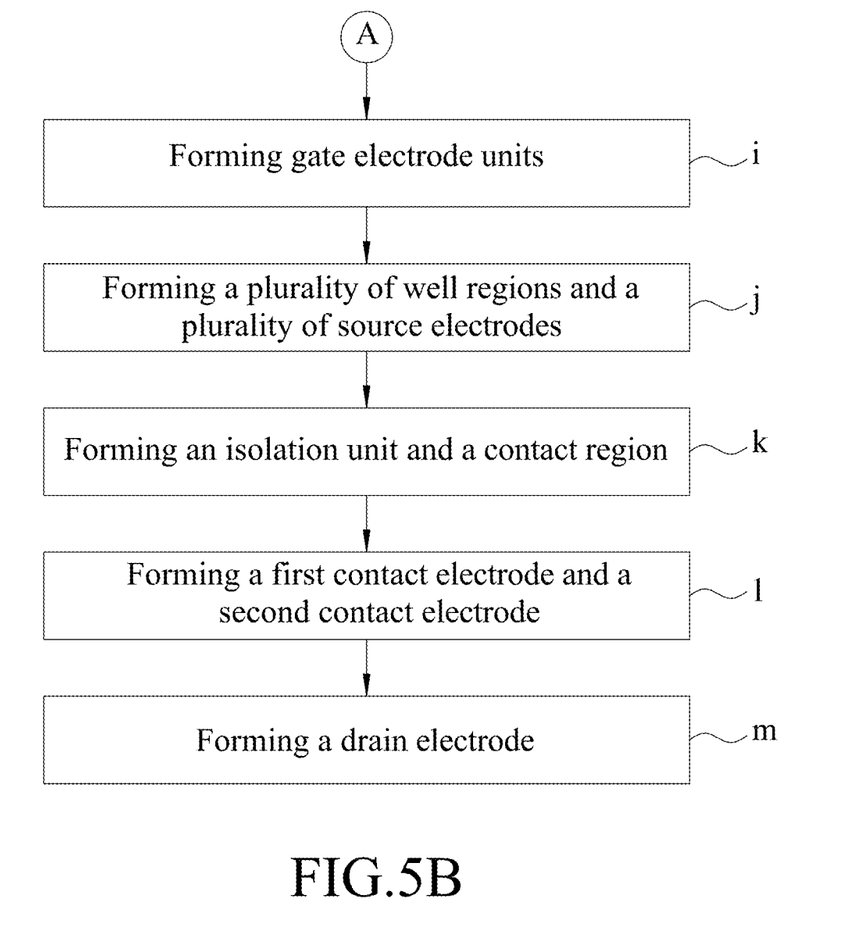

FIGS. 5A and 5B illustrate a flow diagram of a method for manufacturing the embodiment illustrated in FIGS. 1 to 4. FIGS. 6 to 21 are schematic views showing some intermediate stages of the method depicted in FIGS. 5A and 5B, in which FIGS. 6 to 13 are schematic views showing the intermediate stages of the method for manufacturing the embodiment shown by the schematic sectional view of FIG. 2, and FIGS. 14 to 21 are schematic views showing the intermediate stages of the method for manufacturing the embodiment shown by the schematic sectional view of FIG. 3. Additional steps can be provided before, after or during the method, and some of the steps described herein may be replaced by other steps or be eliminated.

Figure 6:
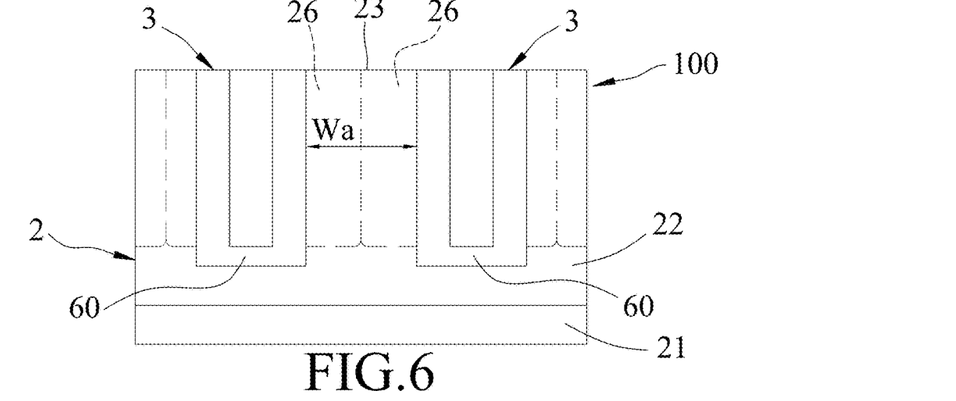
FIGS. 6 to 13 are schematic views illustrating the method for manufacturing the embodiment shown by the schematic sectional view of FIG. 2, and FIGS. 14 to 21 are schematic views illustrating the method for manufacturing the embodiment shown by the schematic sectional view of FIG. 3.
Figure 14:
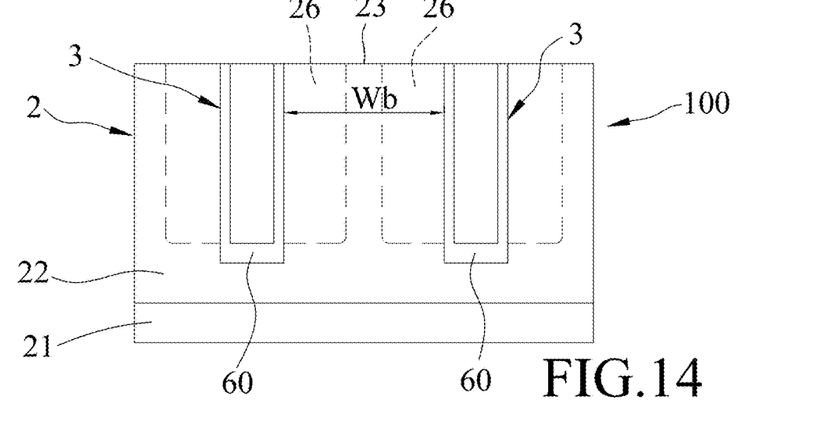

Referring to FIGS. 5A, 6, and 14, the method for manufacturing the embodiment illustrated in FIGS. 1 to 4 begins at step a), where the epitaxial substrate 21 and the epitaxial layer 22 are formed by epitaxial growth. Both of the epitaxial substrate 21 and the epitaxial layer 22 have the first conductive type. The epitaxial layer 22 is disposed on the epitaxial substrate 21, and has a doping concentration smaller than that of the epitaxial substrate 21.

Referring to FIGS. 5A, 6, and 14, the method for manufacturing the embodiment illustrated in FIGS. 1 to 4 proceeds to step b), where the plurality of trenches 3 are formed. The trenches 3 are formed by patterning the epitaxial layer 22 with a patterned mask using an etching process. The trenches 3 are spaced apart from each other and have substantially the same depths. Referring to FIGS. 1 and 2, as described above, each of the trenches 3 has the first trench region 31, the second trench region 33 having the width less than the width of the first trench region 31 in the first direction (X), and the neck trench region (32) extending between the first trench region 31 and the second trench region 33 and having the width in the first direction (X) decreasing gradually along the second direction (Y) from the width of the first trench region 31 to the width of the second trench region 33. In addition, each of the trenches 3 has the upper trench portion 34 and the lower trench portion 35 disposed below and spatially communicating with the upper trench portion 34 in the depth direction (Z).

Referring to FIGS. 5A, 6, and 14, the method for manufacturing the embodiment illustrated in FIGS. 1 to 4 proceeds to step c), where the ion doping regions 26 having the first conductive type are formed. An insulation protective layer (not shown) having a predetermined height is formed on the epitaxial layer 22, and a tilt ion implantation process is conducted at a tilt angle of about 4° to about 15° relative to sidewalls of the trenches 3 so as to form the ion doping regions 26. Each pair of the ion doping regions 26 are formed in a corresponding one of the mesa regions 23 disposed between two corresponding ones of the trenches 3. Since the tilt ion implantation process is conducted at the tilt angle relative to the sidewalls of the trenches 3, the ion doping regions 26 thus formed are not formed in portions of the epitaxial layer 22 disposed below the trenches 3, so as to avoid voltage reduction of the trench-gate field effect transistor to be manufactured. The insulation protective layer is removed after the ion doping regions 26 are formed. Since the first width (Wa) of each of the mesa regions 23 is smaller than the second width (Wb) of the each of the mesa regions 23, the portions of each pair of the ion doping regions 26 disposed between the first trench regions 31 of two corresponding adjacent ones of the trenches 3 are connected to each other, as shown in FIG. 2, and the portions of each pair of the ion doping regions 26 disposed between the second trench regions 33 of two corresponding adjacent ones of the trenches 3 are spaced apart from each other in the first direction, as shown in FIGS. 3 and 4.

Referring to FIGS. 5A, 6, and 14, the method for manufacturing the embodiment illustrated in FIGS. 1 to 4 proceeds to step d), where an insulation layer 60 is formed. The insulation layer 60 is conformally formed in each of the trenches 3 by a deposition process, a thermal oxidation process, or a polymerization deposition using tetraethoxysilane (TEOS) as a precursor to form a first semi-product 100

Figure 7:
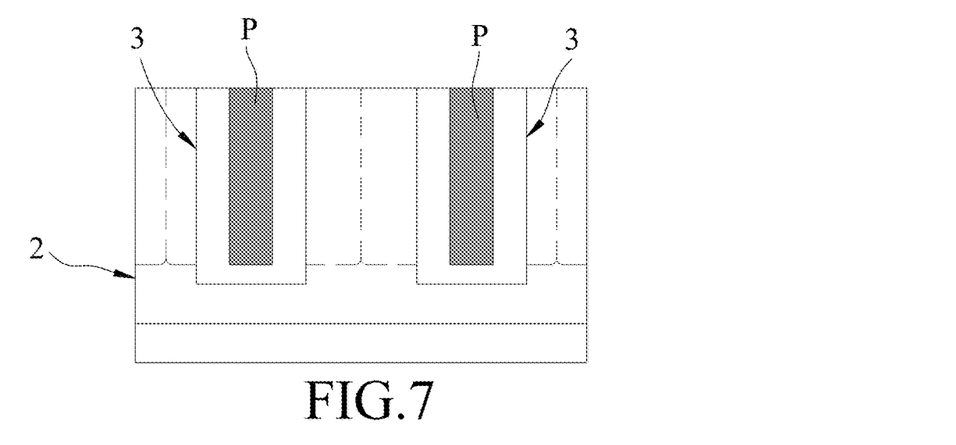
Figure 15:
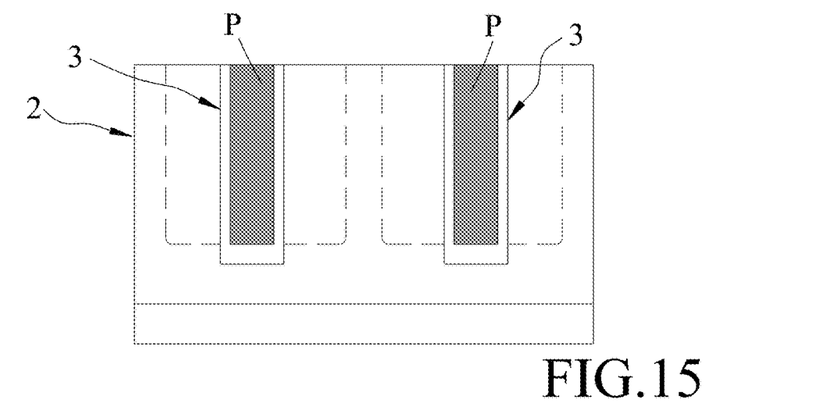

Referring to FIGS. 5A, 7, and 15, the method for manufacturing the embodiment illustrated in FIGS. 1 to 4 proceeds to step e), where a polysilicon material (P) is filled in each of the trenches 3. The polysilicon material (P) may be filled in each of the trenches 3 by, for example, but not limited to, a suitable deposition process.

Figure 8:
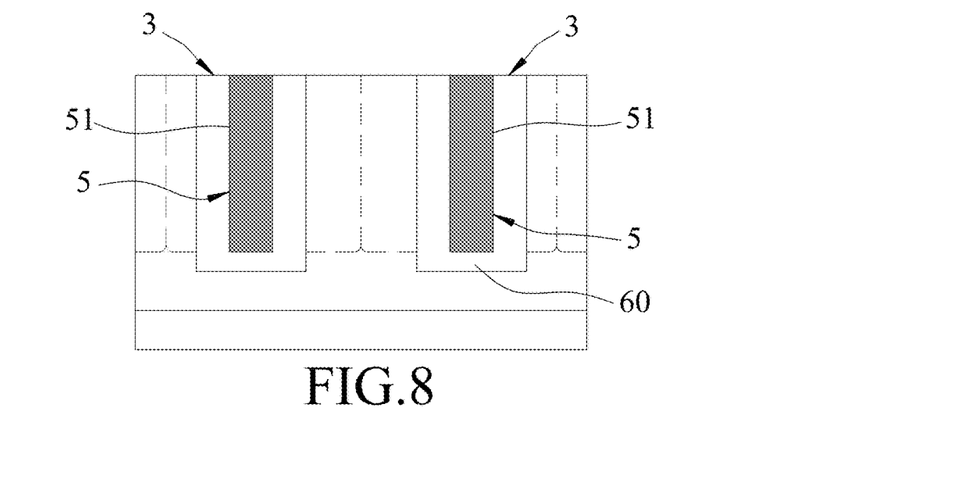
Figure 16:
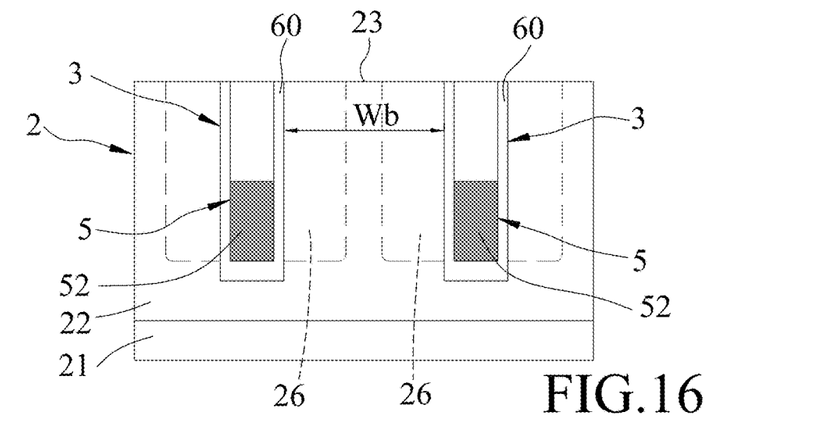

Referring to FIGS. 5A, 8, and 16, the method for manufacturing the embodiment illustrated in FIGS. 1 to 4 proceeds to step f), where a portion of the polysilicon material (P) disposed in an upper portion of the second trench region 33 and an upper portion of the neck trench region 32 of each of the trenches 3 is removed by etching using a patterned mask (not shown) disposed on the epitaxial layer 22, such that a portion of the polysilicon material (P) remained in a lower portion of the second trench region 33 and a lower portion of the neck trench region 32 of each of the trenches 3 is formed into the second source electrode portion 52 of a corresponding one of the source electrode units 6 and such that a portion of the polysilicon material (P) remained in the first trench region 31 of each of the trenches 3 is formed into the first source electrode portion 51 of the corresponding one of the source electrode units 5. Thereafter, the patterned mask is removed.

Figure 9:
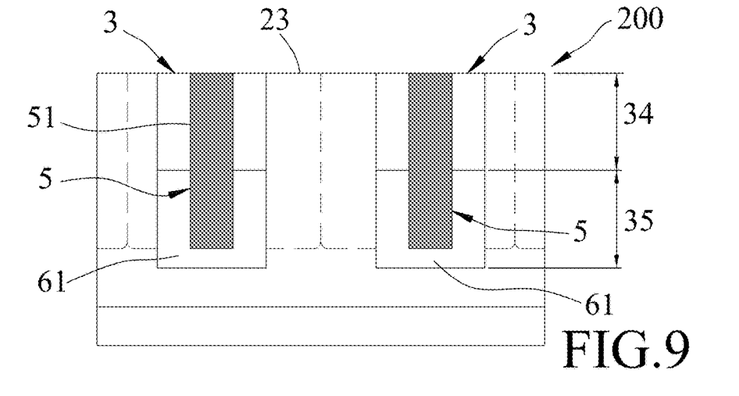
Figure 17:
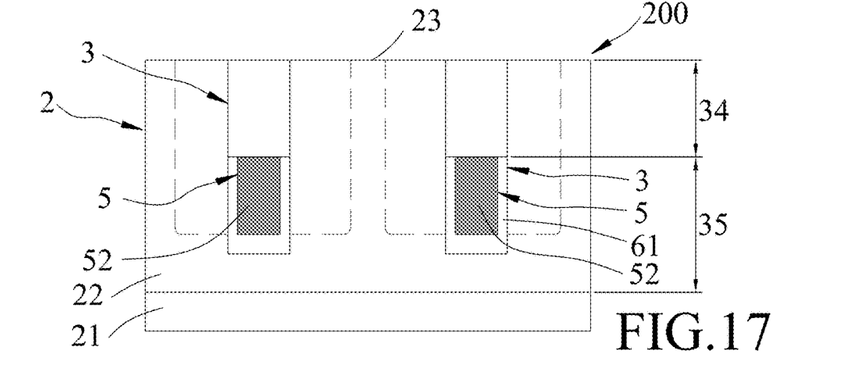

Referring to FIGS. 5A, 9, and 17, the method for manufacturing the embodiment illustrated in FIGS. 1 to 4 proceeds to step g), where a portion of the insulation layer 60 disposed in the upper trench portion 34 of each of the trenches 3 is removed by etching, such that remainder of the insulation layer 60 disposed in the lower trench portion 35 of each of the trenches 3 is formed into the first insulation layer 61, so as to obtain a second semi-product 200, in which the first source electrode portion 51 of each of the source electrode units 5 is spaced apart from a corresponding one of the mesa regions 23.

Figure 10:
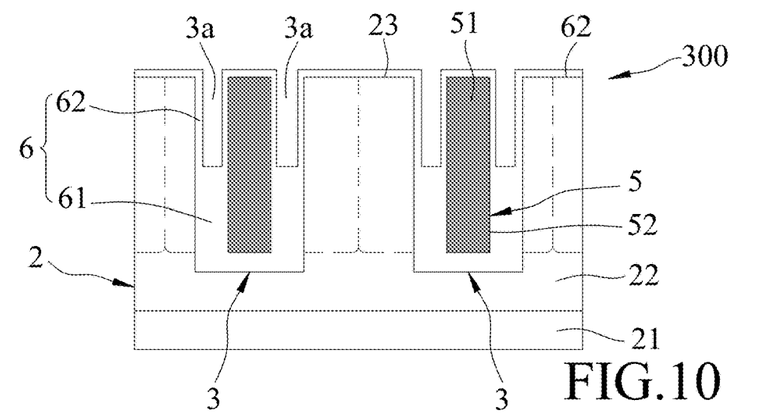
Figure 18:
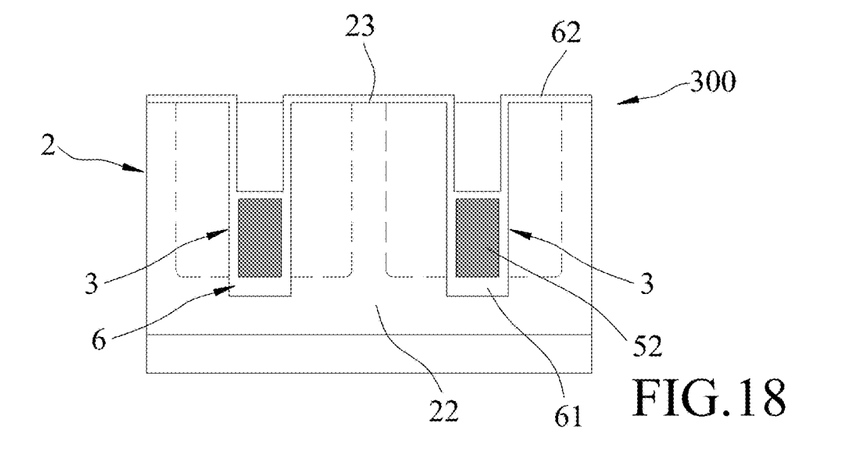

Referring to FIGS. 5A, 10, and 18, the method for manufacturing the embodiment illustrated in FIGS. 1 to 4 proceeds to step h), where the second insulation layer 62 is formed. The insulation layer 62 is conformally formed on the second semi-product 200 shown in FIGS. 9 and 17 to cover lateral surfaces of the trenches 33, lateral surfaces of the first source electrode portions 51, top surfaces of the first insulation layers 61, and top surfaces of the second source electrode portions 52, so as to obtain a third semi-product 300, in which two recesses 3a opposite to each other with respect to the first source electrode portion 51 are formed in the first trench region 31 of each of the trenches 3.

Figure 11:
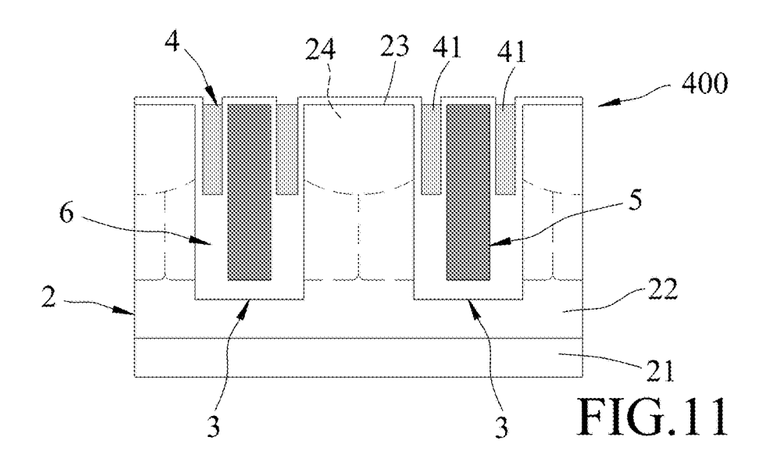
Figure 19:
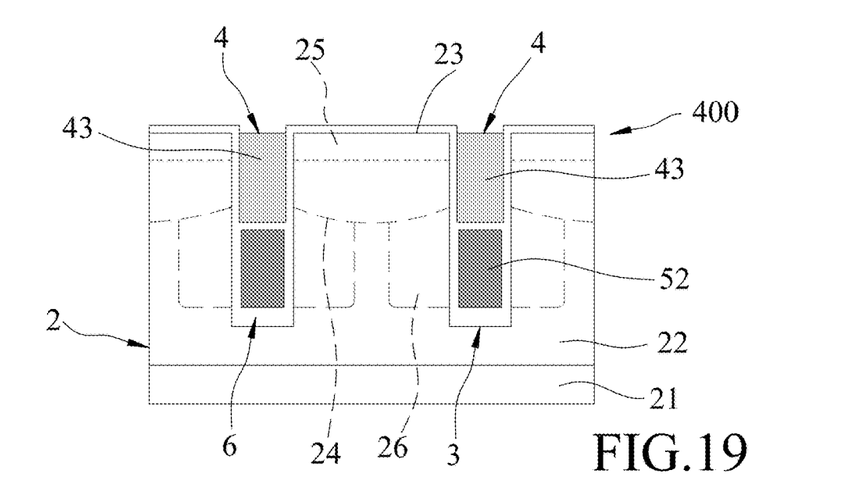

Referring to FIGS. 5B, 11, and 19, the method for manufacturing the embodiment illustrated in FIGS. 1 to 4 proceeds to step i), where the gate electrode units 4 are formed. A polysilicon material is filled in the trenches 3 and the recesses 3a so as to form the gate electrode units 4 in the upper trench portions 34 of the trenches 3. The polysilicon material filled in the recesses 3a disposed in the first trench region 31 of each of the trenches 3 is formed into a pair of the first gate electrode portions 41 of a corresponding one of the gate electrode units 4, and the polysilicon material filled in the neck trench region 32 and the second trench region 33 of each of the trenches 3 is formed into a pair of the second gate electrode portions 42 and the third gate electrode portion 43 of a corresponding one of the gate electrode units 4.

Referring to FIGS. 5B, 11, and 19, the method for manufacturing the embodiment illustrated in FIGS. 1 to 4 proceeds to step j), where the well regions 24 and the source electrodes 25 are formed. The well regions 24 having the second conductive type are formed downwardly from the top surfaces of the mesa regions 23, respectively, by an ion implantation process. The well regions 24 are formed in the upper trench portions 34 of the trenches 3, respectively. Thereafter, the source electrodes 25 having the first conductive type are formed in the well regions 24, respectively, by the ion implantation process, an annealing process, and the like, so as to obtain a fourth semi-product 400. Each of the source electrodes 25 is disposed substantially between the neck trench region 32 and the second trench region 33 of one of two corresponding ones of the trenches 3 and the neck trench region 32 and the second trench region 33 of the other one of the two corresponding ones of the trenches 3, as shown in FIGS. 1 and 3.

Figure 12:
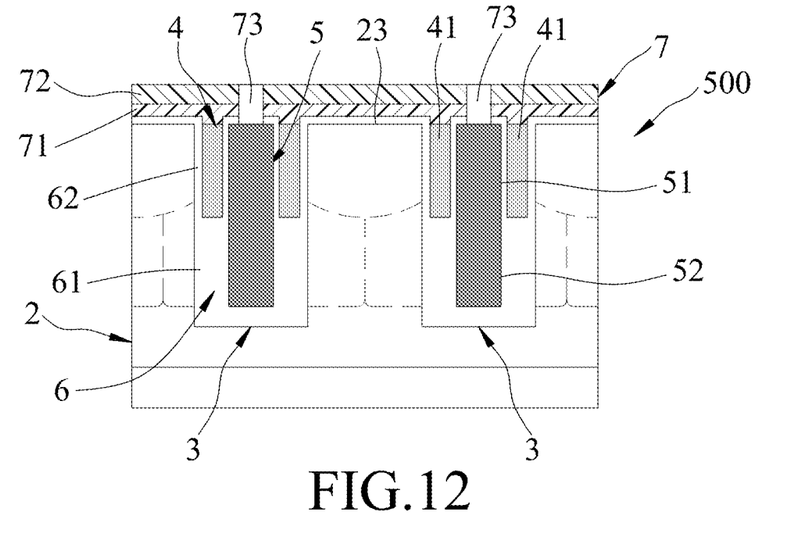
Figure 20:
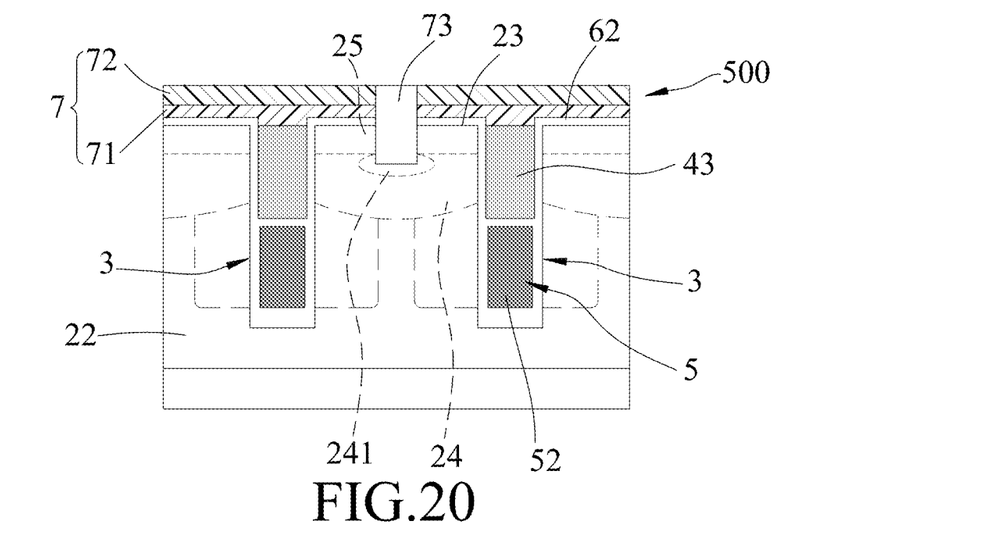

Referring to FIGS. 5B, 12, and 20, the method for manufacturing the embodiment illustrated in FIGS. 1 to 4 proceeds to step k), where the isolation unit 7 and the contact region 241 are formed. The isolation unit 7 is formed by depositing one or more dielectric insulation materials on the epitaxial layer 22 of the fourth semi-product 400 shown in FIGS. 11 and 19. In the embodiment, the isolation unit 7 includes the first isolation layer 71 disposed on the epitaxial layer 22 and the second isolation layer 72 disposed on the first isolation layer 71. The first isolation layer 71 is formed by depositing the low temperature oxide (LTO) on the epitaxial layer 22, and the second isolation layer 72 is formed by depositing the borophosphor silicate glass (BPSG) on the first isolation layer 71. Thereafter, the isolation unit 7 is patterned by etching to form the openings 73, thereby exposing the polysilicon material and the source electrodes 25 through the openings 73 and obtaining a fifth semi-product 500.

Some of the openings 73 are formed in positions corresponding to the positions of the first source electrode portions 51 disposed in the first trench regions 31 of the trenches 3, as shown in FIG. 2. Some of the openings 73 are formed in positions corresponding to the positions of the third gate electrode portions 43 disposed in the second trench regions 33 of the trenches 3, as shown in FIG. 4. Remaining ones of the openings 73 are formed in positions corresponding to the positions of the source electrodes 25 and extend to the well regions 24, as shown in FIG. 3. Thereafter, the contact region 241 is formed below each of the openings 73 disposed in positions corresponding to the positions of the source electrodes 25. The contact region 241 has a conductive type that is the same as that of the well regions 24 and has a doping concentration that is greater than that of the well regions 24.

Figure 13:
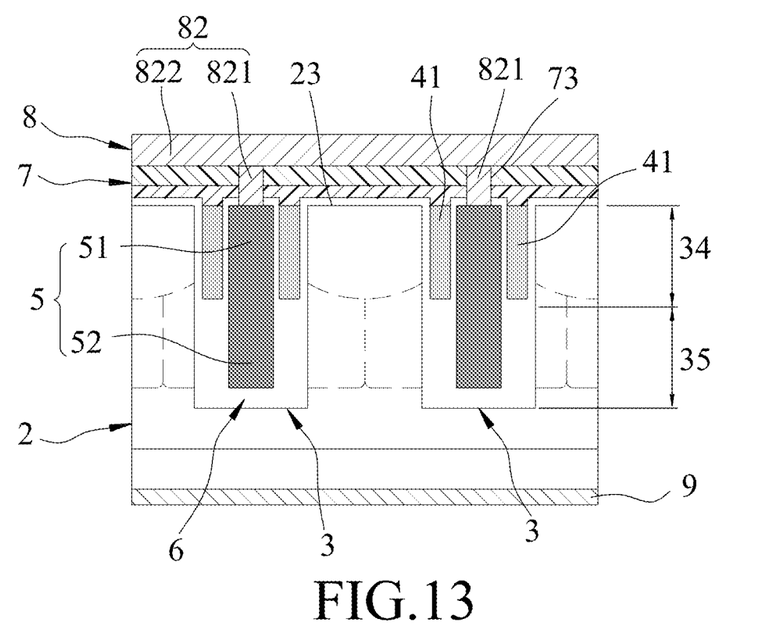
Figure 21:
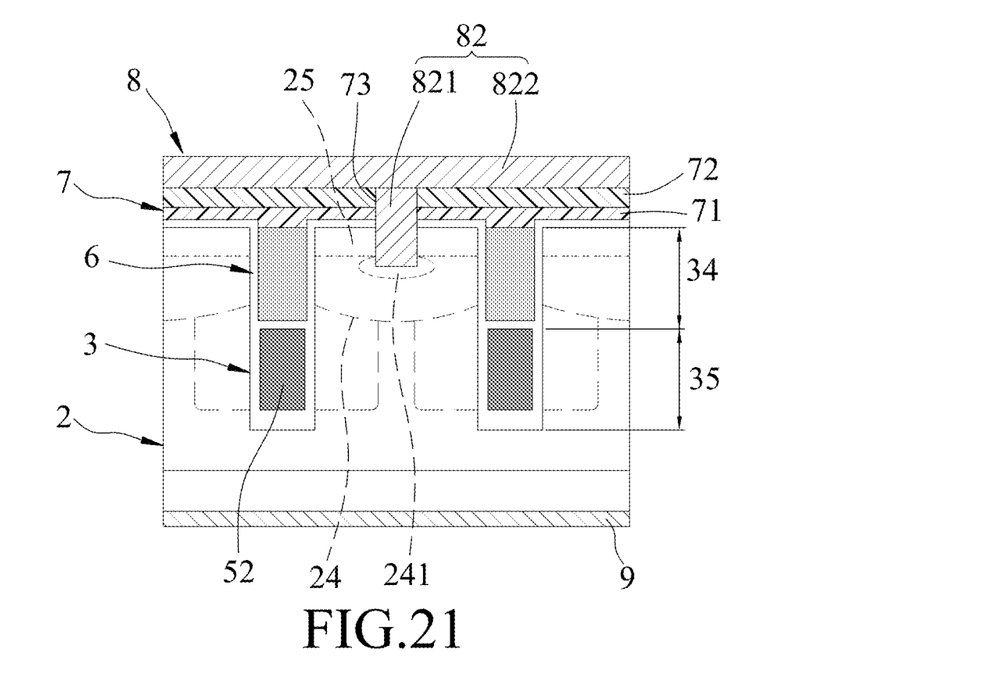

Referring to FIGS. 5B, 13, and 21, the method for manufacturing the embodiment illustrated in FIGS. 1 to 4 proceeds to step I), where the first contact electrode 81 and the second contact electrode 82 are formed. The first contact plugs 811 and the second contact plugs 821 are formed by filling a first conductive material in the openings 73 using a deposition process. Each of the first contact plugs 811 thus formed is electrically connected to the third gate electrode portion 43 of a corresponding one of the gate electrode units 4. The second contact plugs 821 thus formed permit each of the source electrodes 25 to be electrically connected to a corresponding one of the second contact plugs 821 and permit the first source electrode portion 51 of each of the source electrode units 5 to be electrically connected to a corresponding one of the second contact plugs 821. Thereafter, the first extension electrode portion 812 and the second extension electrode portion 822 are formed on the isolation unit 7 by depositing a second conductive material on the isolation unit 7, so as to form the first contact electrode 81 and the second contact electrode 82, which are electrically isolated from each other. The first extension electrode portion 812 is electrically connected to the first contact plugs 811, and the second extension electrode portion 822 is electrically connected to the second contact plugs 821. The first conductive material may be the same as or different from the second conductive material. In the embodiment, the first conductive material includes titanium, tungsten, or an alloy thereof, and the second conductive material includes aluminum.

Referring to FIGS. 5B, 14, and 22, the method for manufacturing the embodiment illustrated in FIGS. 1 to 4 proceeds to step m), where the drain electrode 9 is formed. The drain electrode 9 is formed on the epitaxial substrate 21 opposite to the epitaxial layer 22 by depositing a conductive material on the epitaxial substrate 21. In the embodiment, the conductive material for forming the drain electrode 9 includes a conductive material, for example, but not limited to, a metal, a transparent conductive metal oxide, a conductive polymer, or the like.

In the method for manufacturing the trench-gate field effect transistor according to the disclosure, the first contact plugs 811 are formed in positions corresponding to the positions of the second trench regions 33, and the second contact plugs 821 are formed in positions corresponding to the positions of the first trench regions 31, which are distal from the positions of the second trench regions 33. Therefore, the problems such as short circuit, inferior yield, or the like caused by the process defects described above may be reduced or avoided, the process stability may be enhanced, and the miniaturization of the trench-gate field-effect transistor may be achieved accordingly.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A trench-gate field effect transistor, comprising:
an epitaxial lamination structure which includes an epitaxial substrate having a first conductive type, an epitaxial layer disposed on said epitaxial substrate and having the first conductive type, a plurality of mesa regions disposed in said epitaxial layer and spaced apart from each other in a first direction, a plurality of well regions having a second conductive type and formed downwardly from top surfaces of said mesa regions, respectively, and a plurality of source electrodes having the first conductive type and disposed in said well regions, respectively;
a plurality of trenches which are recessed downwardly from a top surface of said epitaxial layer, which extend in a second direction transverse to the first direction, and which are spaced apart from each other in the first direction, each of said trenches having a first trench region extending in the second direction and having a width in the first direction, a second trench region extending in the second direction and having a width in the first direction smaller than the width of said first trench region, and a neck trench region extending between said first trench region and said second trench region and having a width in the first direction decreasing gradually along the second direction from the width of said first trench region to the width of said second trench region, each of said trenches having an upper trench portion and a lower trench portion disposed below and spatially communicating with said upper trench portion in a depth direction transverse to the first and second directions, each of said mesa regions being disposed between two corresponding ones of said trenches;
a plurality of gate electrode units, each of which is disposed in said upper trench portion of a corresponding one of said trenches, and each of which includes a pair of first gate electrode portions disposed in said first trench region of a corresponding one of said trenches and spaced apart from each other in the first direction, a pair of second gate electrode portions disposed in said neck trench region of said corresponding one of said trenches, and a third gate electrode portion disposed in said second trench region of said corresponding one of said trenches, such that each of said second gate electrode portions interconnects a corresponding one of said first gate electrode portions and said third gate electrode portion;
a plurality of source electrode units which are disposed in said trenches, respectively, each of said source electrode units including a first source electrode portion disposed between a pair of said first gate electrode portions of a corresponding one of said gate electrode units, and a second source electrode portion connected to said first source electrode portion, said first source electrode portion having a top end surface at a same level with said top surface of said epitaxial layer and extending downwardly in the depth direction from said top end surface into said lower trench portion, said second source electrode portion being connected to a lower part of said first source electrode portion disposed in said lower trench portion and extending through said neck trench region to said second trench region;

a plurality of insulation units which are disposed in said trenches, respectively, and which cover said gate electrode units and said source electrode units, respectively;

an isolation unit which is disposed on said epitaxial layer and which has an electric insulating property;

a contact electrode unit which includes a first contact electrode electrically connected to said third gate electrode portion of each of the gate electrode units and a second contact electrode electrically connected to said source electrodes and said source electrode units; and a drain electrode which is disposed on said epitaxial substrate opposite to said epitaxial layer.

2. The trench-gate field effect transistor as claimed in claim 1, wherein said first contact electrode includes a plurality of first contact plugs each penetrating the isolation unit so as to be electrically connected to said third gate electrode portion of a corresponding one of said gate electrode units and a first extension electrode portion disposed on said isolation unit and electrically connected to said first contact plugs).

3. The trench-gate field effect transistor as claimed in claim 1, wherein said second contact electrode includes a plurality of second contact plugs penetrating the isolation unit so as to permit each of said source electrodes to be electrically connected to a corresponding one of said second contact plugs and to permit said first source electrode portion of each of said source electrode units to be electrically connected to a corresponding one of said second contact plugs, and a second extension electrode portion disposed on said isolation unit and electrically connected to said second contact plugs.

4. The trench-gate field effect transistor as claimed in claim 1, wherein said isolation unit includes a first isolation layer disposed on said epitaxial layer, and a second isolation layer disposed on said first isolation layer.

5. The trench-gate field effect transistor as claimed in claim 1, wherein said isolation unit includes a material selected from a group consisting of silicon oxide, phosphor silicate glass, and a combination thereof.

6. The trench-gate field effect transistor as claimed in claim 1, wherein said epitaxial layer has a thickness ranging from 3 µm to 15 µm.

7. The trench-gate field effect transistor as claimed in claim 1, wherein each of said trenches has a depth ranging from 2 µm to 9 µm.

8. The trench-gate field effect transistor as claimed in claim 1, wherein a center distance in the first direction between said first trench region of each of said trenches and said first trench region of an adjacent one of said trenches ranges from 2.5 µm to 5.0 µm.

9. The trench-gate field effect transistor as claimed in claim 1, wherein each of said mesa regions has a first width in the first direction between said first trench regions of two corresponding adjacent ones of said trenches, the first width ranging from 1.0 µm to 2.8 µm.

10. The trench-gate field effect transistor as claimed in claim 1, wherein each of said mesa regions has a second width in the first direction between said second trench regions of two corresponding adjacent ones of said trenches, the second width ranging from 1.5 µm to 3.5 µm.

11. The trench-gate field effect transistor as claimed in claim 8, wherein the center distance ranges from 2.5 µm to 3.5 µm.

12. The trench-gate field effect transistor as claimed in claim 9, wherein the first width ranges from 1.0 µm to 1.3 µm.

13. The trench-gate field effect transistor as claimed in claim 10, wherein the second width ranges from 1.5 µm to 2.0 µm.

14. The trench-gate field effect transistor as claimed in claim 1, wherein each of said mesa regions includes a pair of ion doping regions disposed below a corresponding one of said well regions, each of said ion doping regions being disposed adjacent to a corresponding one of said trenches, portions of the pair of said ion doping regions disposed between said first trench regions of two corresponding adjacent ones of said trenches being connected to each other, portions of the pair of said ion doping regions disposed between said second trench regions of two corresponding adjacent ones of said trenches being spaced apart from each other in the first direction, said ion doping regions having the first conductive type and having a doping concentration greater than that of said epitaxial layer.

15. The trench-gate field effect transistor as claimed in claim 1, wherein each of said insulation units includes a first insulation layer disposed in said lower trench portion of a corresponding one of said trenches and a second insulation layer disposed in said upper trench portion of the corresponding one of said trenches, said first insulation layer having a thickness greater than that of said second insulation layer.

16. The trench-gate field effect transistor as claimed in claim 15, wherein said first insulation layer has a thickness ranging from 200 nm to 1000 nm.

* * * * *